(12) United States Patent
Shioda

(10) Patent No.: US 11,955,545 B2
(45) Date of Patent: Apr. 9, 2024

(54) SEMICONDUCTOR DEVICE AND METHOD OF MANUFACTURING THE SAME

(71) Applicant: Kioxia Corporation, Tokyo (JP)

(72) Inventor: Tomonari Shioda, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 160 days.

(21) Appl. No.: 17/665,031

(22) Filed: Feb. 4, 2022

(65) Prior Publication Data

US 2023/0087572 A1    Mar. 23, 2023

(30) Foreign Application Priority Data

Sep. 17, 2021    (JP) ................................. 2021-152533

(51) Int. Cl.
*H01L 29/78*    (2006.01)
*H01L 29/66*    (2006.01)
*H10B 41/27*    (2023.01)
*H10B 43/27*    (2023.01)

(52) U.S. Cl.
CPC .... *H01L 29/7827* (2013.01); *H01L 29/66666* (2013.01); *H10B 41/27* (2023.02); *H10B 43/27* (2023.02)

(58) Field of Classification Search
None
See application file for complete search history.

(56) References Cited

U.S. PATENT DOCUMENTS

| | | | |
|---|---|---|---|
| 9,257,552 B2 | 2/2016 | Mizushima | |
| 10,615,170 B2 | 4/2020 | Maeda et al. | |
| 10,964,716 B2 | 3/2021 | Mori et al. | |
| 2019/0067317 A1* | 2/2019 | Shioda | H10B 43/27 |
| 2021/0057444 A1 | 2/2021 | Park et al. | |
| 2021/0082934 A1 | 3/2021 | Iwamoto | |

FOREIGN PATENT DOCUMENTS

| | | |
|---|---|---|
| JP | 2015-53336 A | 3/2015 |
| JP | 2019-54220 A | 4/2019 |
| JP | 2020-43287 A | 3/2020 |
| JP | 2021-34720 A | 3/2021 |
| JP | 2021-48256 A | 3/2021 |

\* cited by examiner

*Primary Examiner* — Hsien Ming Lee
(74) *Attorney, Agent, or Firm* — Oblon, McClelland, Maier & Neustadt, L.L.P.

(57) ABSTRACT

In one embodiment, a semiconductor device includes a substrate, and a first semiconductor layer provided on the substrate and including a first crystal grain. The device further includes a first film provided on a surface of the first semiconductor layer. The device further includes a second semiconductor layer provided on a surface of the first film, provided on the surface of the first semiconductor layer via an opening in the first film, including a second crystal grain, and included in a memory cell. Furthermore, a grain size of the second crystal grain is larger than a maximum value of a width of the second semiconductor layer in the opening.

20 Claims, 16 Drawing Sheets

SEMICONDUCTOR DEVICE AND METHOD OF MANUFACTURING THE SAME

CROSS-REFERENCE TO RELATED APPLICATION

This application is based upon and claims the benefit of priority from the prior Japanese Patent Application No. 2021-152533, filed on Sep. 17, 2021, the entire contents of which are incorporated herein by reference.

FIELD

Embodiments described herein relate to a semiconductor device and a method of manufacturing the same.

BACKGROUND

When a semiconductor device is manufactured, it is desired in some cases to make the grain sizes (grain diameters) of crystal grains in a semiconductor layer large. In these cases, there is a problem how to form such a semiconductor layer.

DETAILED DESCRIPTION

Embodiments will now be explained with reference to the accompanying drawings. The same components are given the same signs in FIGS. 1 to 16, and their duplicated explanation is omitted.

In one embodiment, a semiconductor device includes a substrate, and a first semiconductor layer provided on the substrate and including a first crystal grain. The device further includes a first film provided on a surface of the first semiconductor layer. The device further includes a second semiconductor layer provided on a surface of the first film, provided on the surface of the first semiconductor layer via an opening in the first film, including a second crystal grain, and included in a memory cell. Furthermore, a grain size of the second crystal grain is larger than a maximum value of a width of the second semiconductor layer in the opening.

First Embodiment

Figure 1:
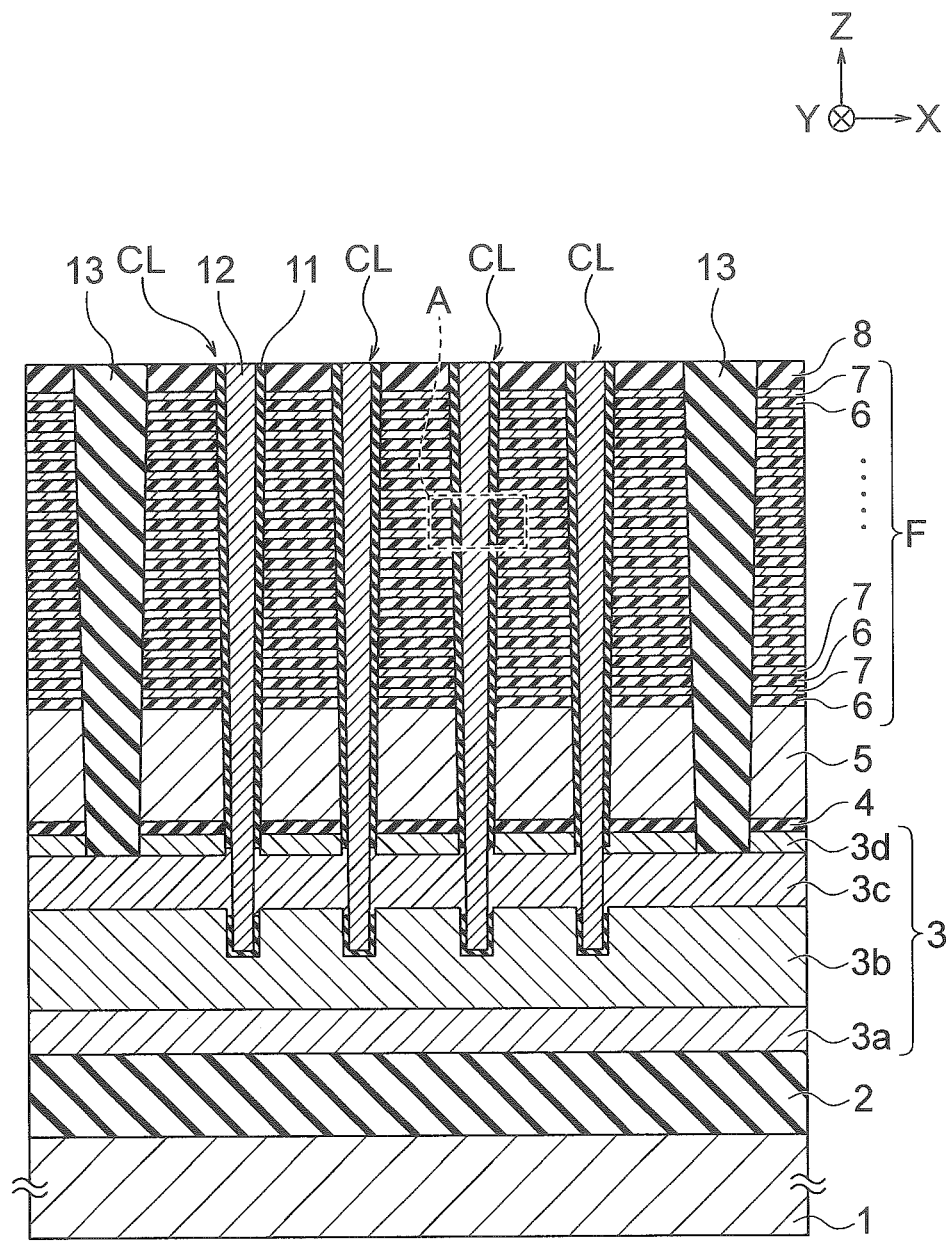
FIG. 1 is a sectional view showing a structure of a semiconductor device of a first embodiment.

FIG. 1 is a sectional view showing a structure of a semiconductor device of a first embodiment.

The semiconductor device of the present embodiment includes a substrate 1, an inter layer dielectric 2, a source layer 3, an inter layer dielectric 4, a gate layer 5, a plurality of insulating layers 6, a plurality of electrode layers 7, an inter layer dielectric 8, a plurality of memory insulators 11, a plurality of channel semiconductor layers 12, and a plurality of slit insulators 13. An example of the semiconductor device of the present embodiment is a three-dimensional memory. The source layer 3 is an example of the first semiconductor layer, each of the memory insulators 11 is an example of the first film, and each of the channel semiconductor layers 12 is an example of the second semiconductor layer.

An example of the substrate 1 is a semiconductor substrate such as a Si (silicon) substrate. FIG. 1 shows an X-direction and a Y-direction which are parallel to a surface of the substrate 1 and perpendicular to each other, and a Z-direction perpendicular to the surface of the substrate 1. In the present specification, the +Z-direction is regarded as the upward direction, and the −Z-direction is regarded as the downward direction. The −Z-direction may coincide with the direction of gravity but does not have to coincide with the direction of gravity. The Z-direction is an example of a predetermined direction.

The inter layer dielectric 2, the source layer 3, the inter layer dielectric 4, and the gate layer 5 are sequentially formed on the substrate 1. An example of the inter layer dielectric 2 is a $SiO_2$ film (silicon oxide film). For example, the source layer 3 includes a metal layer 3a, a lower semiconductor layer 3b, an intermediate semiconductor layer 3c, and an upper semiconductor layer 3d which are sequentially formed on the inter layer dielectric 2, and functions as a source line. An example of the metal layer 3a is a W (tungsten) layer. Examples of the lower semiconductor layer 3b, the intermediate semiconductor layer 3c, and the upper semiconductor layer 3d are polycrystalline semiconductor layers such as polysilicon layers. Each of the lower semiconductor layer 3b, the intermediate semiconductor layer 3c, and the upper semiconductor layer 3d may be a polysilicon layer containing P (phosphorus) atoms or As (arsenic) atoms as impurity atoms. Each of the lower semiconductor layer 3b and the upper semiconductor layer 3d is an example of a first layer, and the intermediate semiconductor layer 3c is an example of a second layer. An example of the inter layer dielectric 4 is a SiO₂ film. An example of the gate layer 5 is a polysilicon layer, which functions as a gate line.

The plurality of insulating layers 6 and the plurality of electrode layers 7 are alternately formed on the gate layer 5, forming a stacked film F. The inter layer dielectric 8 is formed on the stacked film F. An example of each of the insulating layers 6 is a SiO₂ film. An example of each of the electrode layers 7 is a metal layer including a W layer, which functions as a word line or a selection line. An example of the inter layer dielectric 8 is a SiO₂ film.

The semiconductor device of the present embodiment includes a plurality of columnar portions CL which are formed so as to penetrate the inter layer dielectric 8, the stacked film F, the gate layer 5, the inter layer dielectric 4, the upper semiconductor layer 3d, and the intermediate semiconductor layer 3c. Each of the columnar portions CL has a solid columnar shape extending in the Z-direction, and an XY-sectional shape of each of the columnar portions CL is a circle or a figure close to a circle. Each of the columnar portions CL includes the memory insulator 11 and the channel semiconductor layer 12 which are sequentially formed on surfaces of the inter layer dielectric 8, the stacked film F, the gate layer 5, the inter layer dielectric 4, the upper semiconductor layer 3d, the intermediate semiconductor layer 3c, and the lower semiconductor layer 3b. The channel semiconductor layer 12 is in contact with the intermediate semiconductor layer 3c and is electrically connected to the source layer 3 with the intermediate semiconductor layer 3c.

The plurality of slit insulators 13 are formed so as to penetrate the inter layer dielectric 8, the stacked film F, the gate layer 5, the inter layer dielectric 4, and the upper semiconductor layer 3d. Each of the slit insulators 13 has a solid plate shape extending in the Y-direction and the Z-direction. An example of each of the slit insulators 13 is a SiO₂ film.

Figure 2:
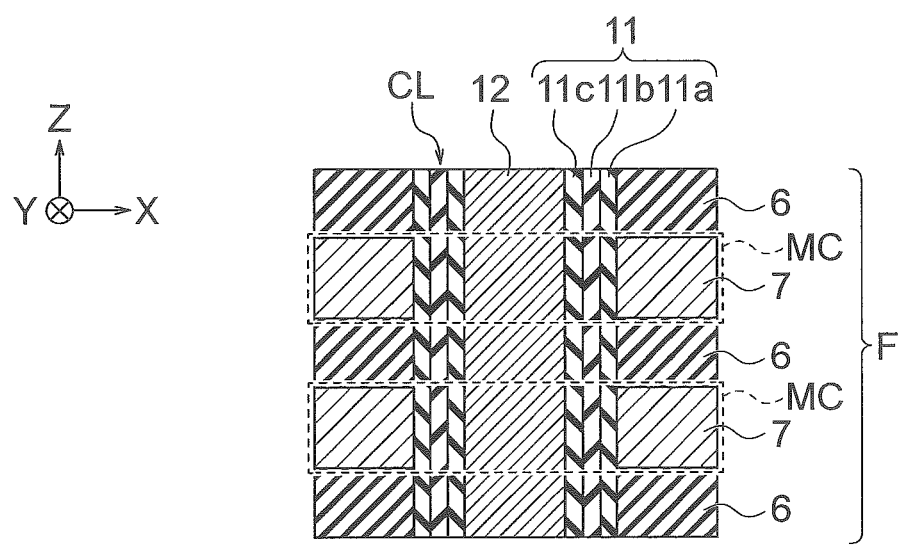
FIG. 2 is an expanded sectional view showing the structure of the semiconductor device of the first embodiment.

FIG. 2 is an expanded sectional view showing the structure of the semiconductor device of the first embodiment. FIG. 2 shows the region A in FIG. 1.

As shown in FIG. 2, the memory insulator 11 includes a block insulator 11a, a charge storage layer 11b, and a tunnel insulator 11c which are sequentially formed on the surfaces of the stacked film F and the like. An example of the block insulator 11a is a SiO₂ film. An example of the charge storage layer 11b is an insulator such as a SiN film (silicon nitride film). The charge storage layer 11b may be a semiconductor layer such as a polysilicon layer. An example of the tunnel insulator 11c is a SiO₂ film. An example of the channel semiconductor layer 12 is a polycrystalline semiconductor layer such as a polysilicon layer. The channel semiconductor layer 12 may be a polysilicon layer containing B (boron) atoms or Ge (germanium) atoms as an impurity element, or may be a polysilicongermanium layer containing B atoms as an impurity element.

FIG. 2 illustrates two of the electrode layers 7, which two function as word lines. Each of these electrode layers 7 forms a memory cell MC together with the columnar portion CL. Each memory cell MC includes the electrode layer 7, the block insulator 11a, the charge storage layer 11b, the tunnel insulator 11c, and the channel semiconductor layer 12. In the present embodiment, the channel semiconductor layer 12 has a solid columnar shape extending in the Z-direction, and the memory insulator 11 has a hollow columnar shape extending in the Z-direction around the channel semiconductor layer 12. Therefore, an XY-sectional shape of the channel semiconductor layer 12 is a circle or a figure close to a circle, and an XY-sectional shape of the memory insulator 11 is an annulus or a figure close to an annulus.

FIGS. 3A to 9B are sectional views showing a method of manufacturing the semiconductor device of the first embodiment.

Figure 3A:
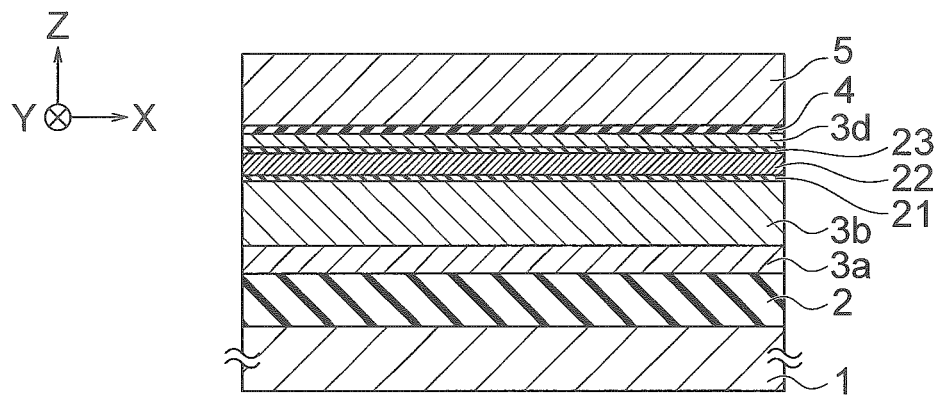
FIGS. 3A and 3B are sectional views showing steps in a method of manufacturing the semiconductor device of the first embodiment.

First, on the substrate 1, the inter layer dielectric 2, the metal layer 3a, the lower semiconductor layer 3b, a lower protecting film 21, a sacrificial layer 22, an upper protecting film 23, the upper semiconductor layer 3d, the inter layer dielectric 4, and the gate layer 5 are sequentially formed (FIG. 3A). An example of the lower protecting film 21 is a SiO₂ film. An example of the sacrificial layer 22 is a polysilicon layer. An example of the upper protecting film 23 is a SiO₂ film. The lower protecting film 21, the sacrificial layer 22, and the upper protecting film 23 are replaced by the intermediate semiconductor layer 3c in a replacing step mentioned later.

Figure 3B:
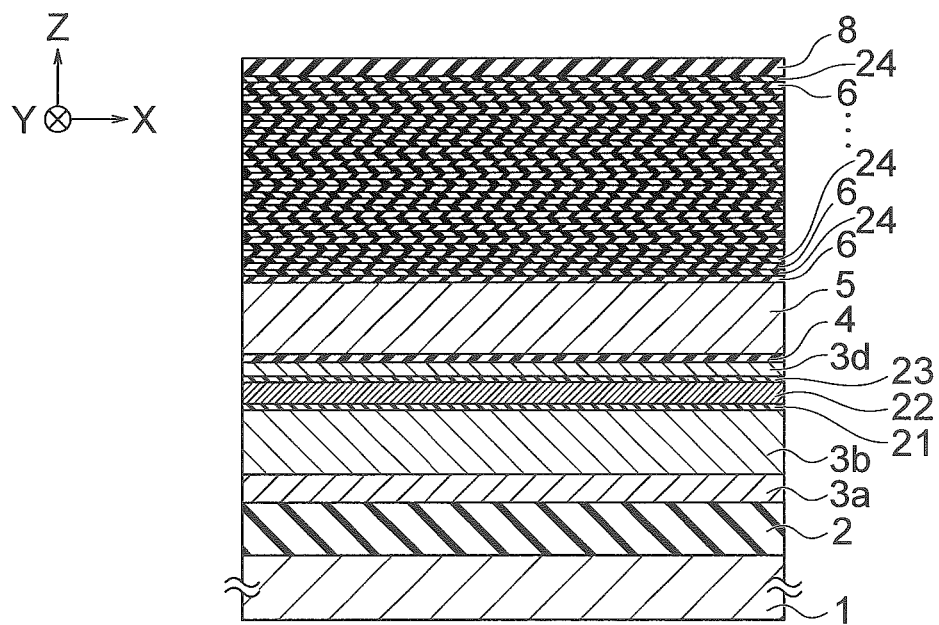

Next, the plurality of insulating layers 6 and a plurality of sacrificial layers 24 are alternately formed on the gate layer 5, and the inter layer dielectric 8 is formed on these insulating layers 6 and sacrificial layers 24 (FIG. 3B). An example of each of the sacrificial layers 24 is a SiN film. The sacrificial layers 24 are replaced by the electrode layers 7 in a replacing step mentioned later. When there is employed a procedure in which this replacing step is omitted, the electrode layers 7 are formed in place of the sacrificial layers 24 in the step of FIG. 3B.

Figure 4A:
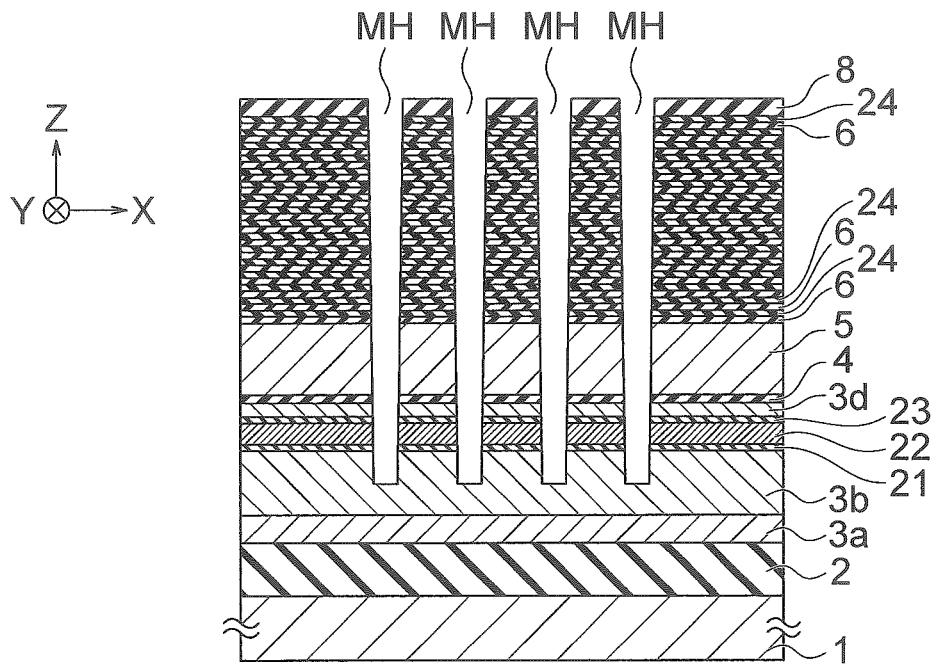
FIGS. 4A and 4B are sectional views showing steps in the method of manufacturing the semiconductor device of the first embodiment.

Next, a plurality of memory holes MH which penetrate the inter layer dielectric 8, the plurality of sacrificial layers 24, the plurality of insulating layers 6, the gate layer 5, the inter layer dielectric 4, the upper semiconductor layer 3d, the upper protecting film 23, the sacrificial layer 22, and the lower protecting film 21 are formed by lithography and RIE (Reactive Ion Etching) (FIG. 4A).

Figure 4B:
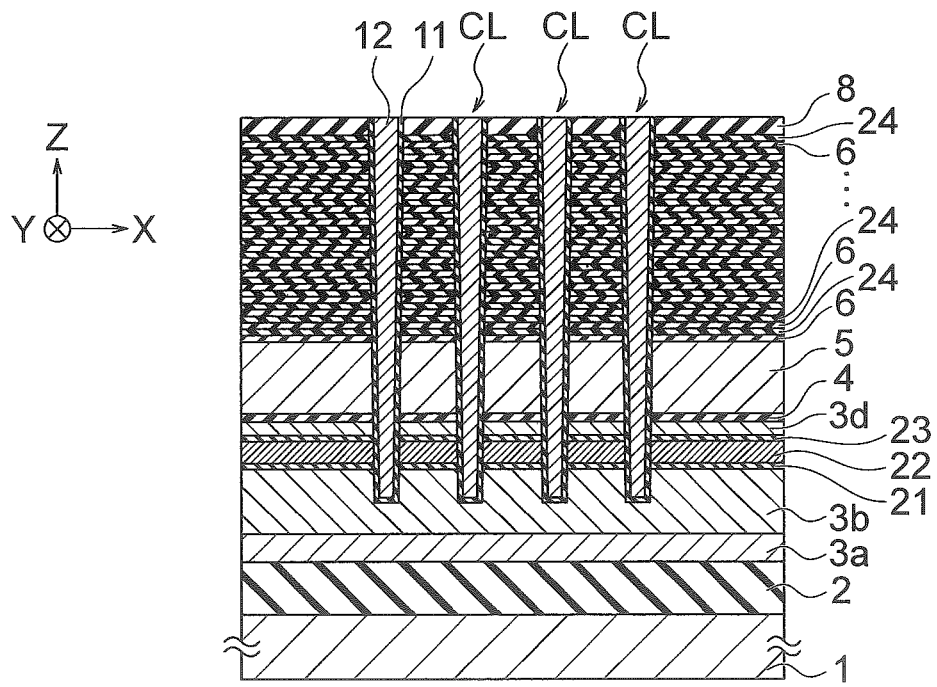

Next, in each of the memory holes MH, the memory insulator 11 and the channel semiconductor layer 12 are sequentially formed (FIG. 4B). Consequently, the columnar portion CL is formed in the memory hole MH. The memory insulator 11 is formed by sequentially forming the block insulator 11a, the charge storage layer 11b, and the tunnel insulator 11c in the memory hole MH (see FIG. 2). In the present embodiment, the memory insulators 11 have not-shown openings, and the channel semiconductor layers 12 are formed by their epitaxial growth from the lower semiconductor layer 3b that are exposed in these openings. Details of this epitaxial growth will be mentioned later.

Figure 5A:
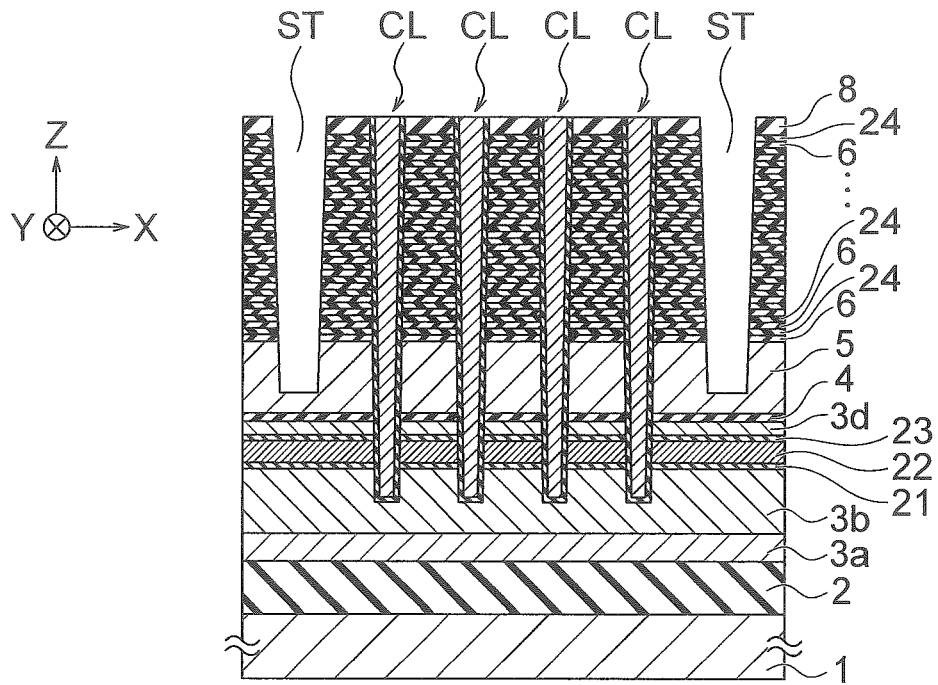
FIGS. 5A and 5B are sectional views showing steps in the method of manufacturing the semiconductor device of the first embodiment.
Figure 5B:
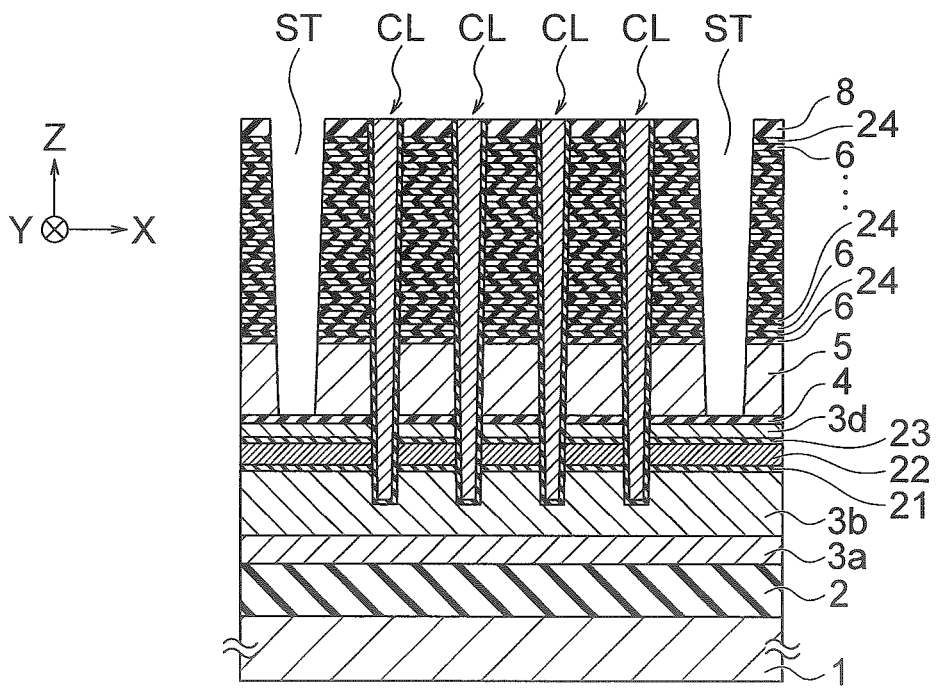
Figure 6A:
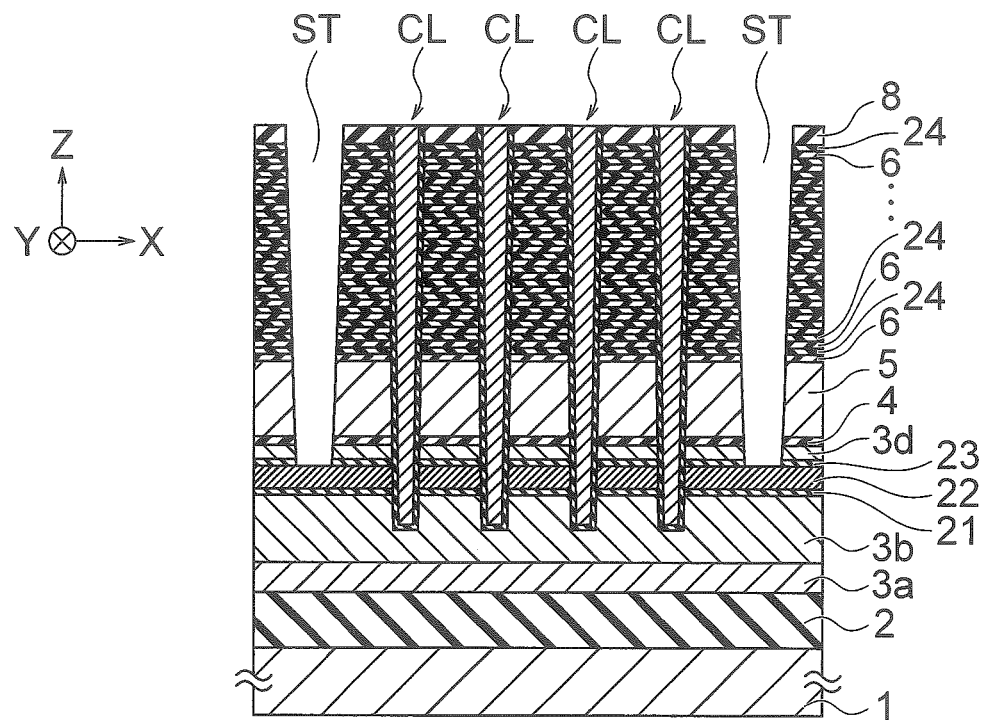
FIGS. 6A and 6B are sectional views showing steps in the method of manufacturing the semiconductor device of the first embodiment.
Figure 6B:
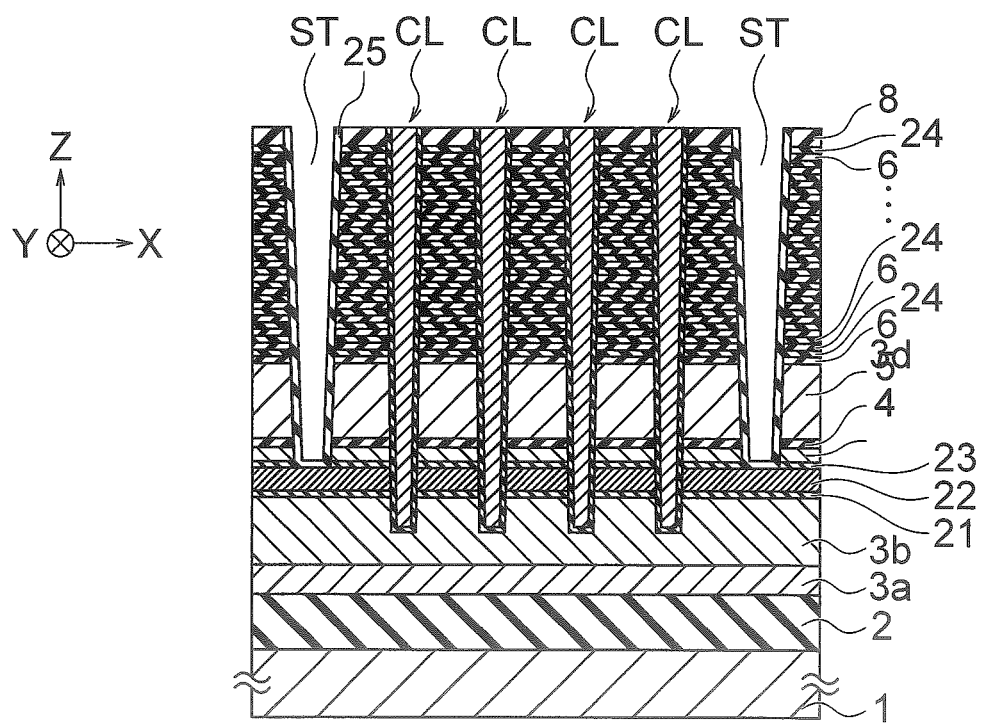

Next, a plurality of slits ST which penetrate the inter layer dielectric 8, the plurality of sacrificial layers 24, the plurality of insulating layers 6, and the gate layer 5 are formed by lithography and RIE (FIGS. 5A and 5B). RIE of the present embodiment is performed using a first etching gas before the stage shown in FIG. 5A and performed using a second etching gas different from the first etching gas after the stage shown in FIG. 5A.

Figure 7A:
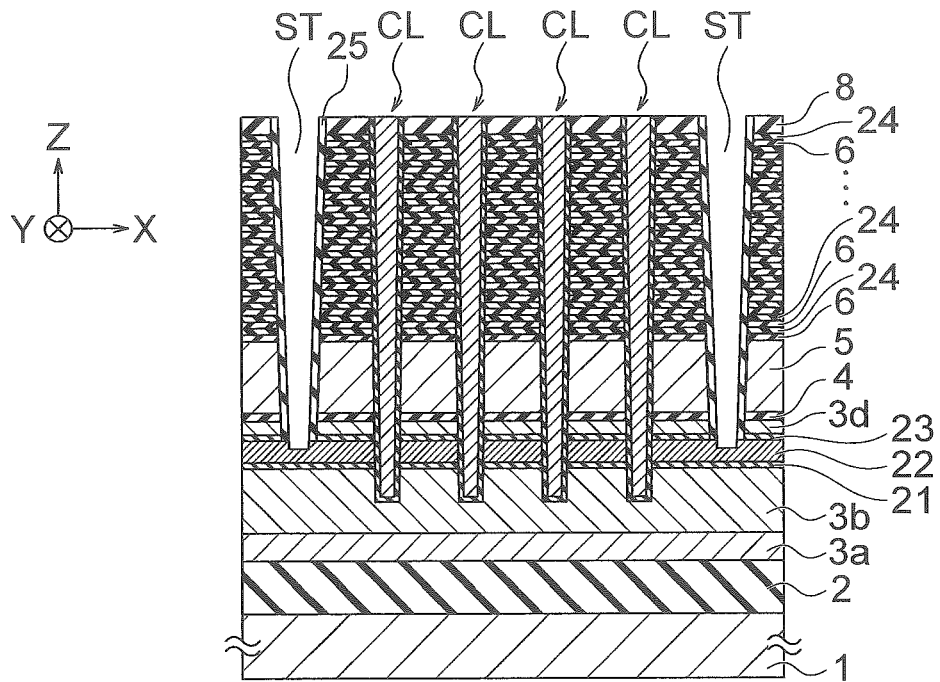
FIGS. 7A and 7B are sectional views showing steps in the method of manufacturing the semiconductor device of the first embodiment.

Next, the upper protecting film 23 is removed from the bottom surfaces of the slits ST by etching (FIG. 6A), liner layers 25 are formed on the surfaces of the slits ST (FIG. 6B), and the liner layers 25 are removed from the bottom surfaces of the slits ST by etching (FIG. 7A). Consequently, the sacrificial layer 22 is exposed on the bottom surfaces of the slits ST while the lateral surfaces of the slits ST are protected by the liner layers 25. An example of each of the liner layers 25 is a SiN film.

Figure 7B:
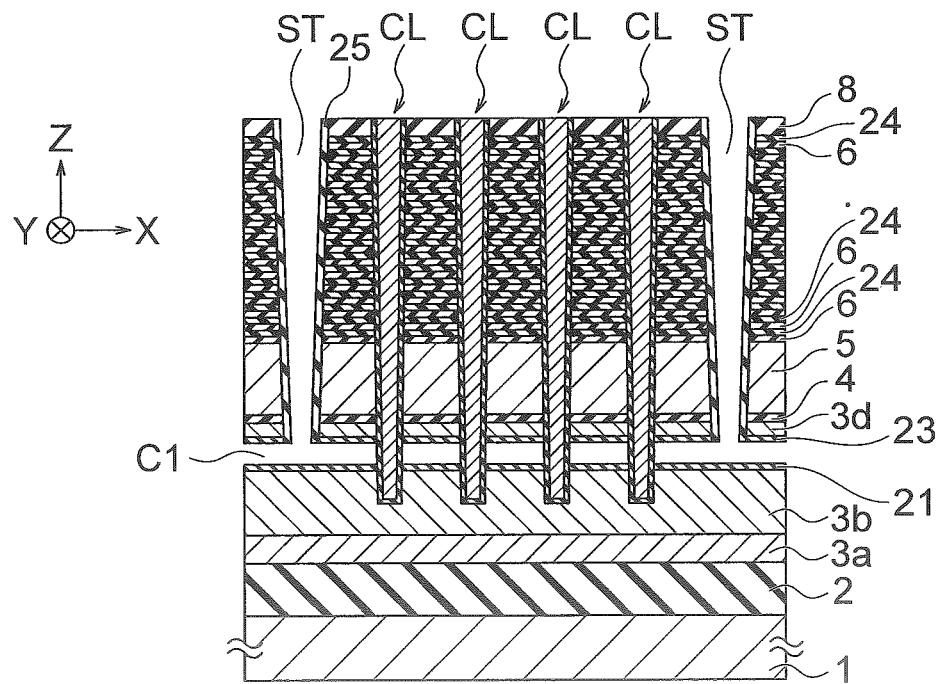

Next, the sacrificial layer 22 is removed by wet etching using the slits ST (FIG. 7B). Consequently, a hollow (air gap) C1 is formed between the lower protecting film 21 and the upper protecting film 23, and the memory insulators 11 are exposed on lateral surfaces of the hollow C1.

Figure 8A:
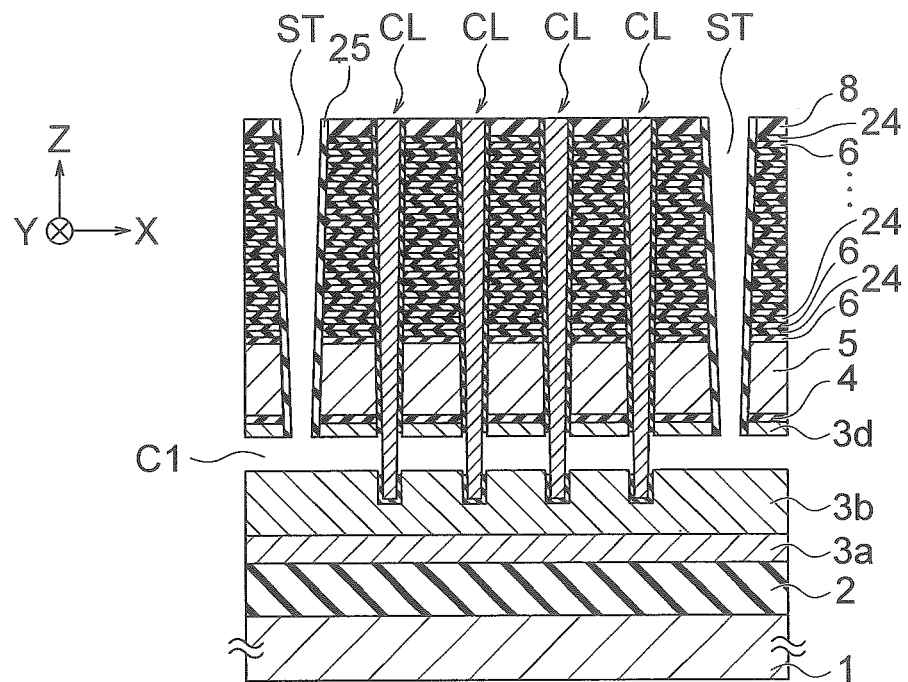
FIGS. 8A and 8B are sectional views showing steps in the method of manufacturing the semiconductor device of the first embodiment.

Next, the lower protecting film 21, the upper protecting film 23, and the memory insulators 11, which are exposed on the lateral surfaces of the hollow C1, are removed by CDE (Chemical Dry Etching) using the slits ST (FIG. 8A). Consequently, the upper semiconductor layer 3d is exposed on the upper surface of the hollow C1, the lower semiconductor layer 3b is exposed on the lower surface of the hollow C1, the channel semiconductor layers 12 are exposed on the lateral surfaces of the hollow C1.

Figure 8B:
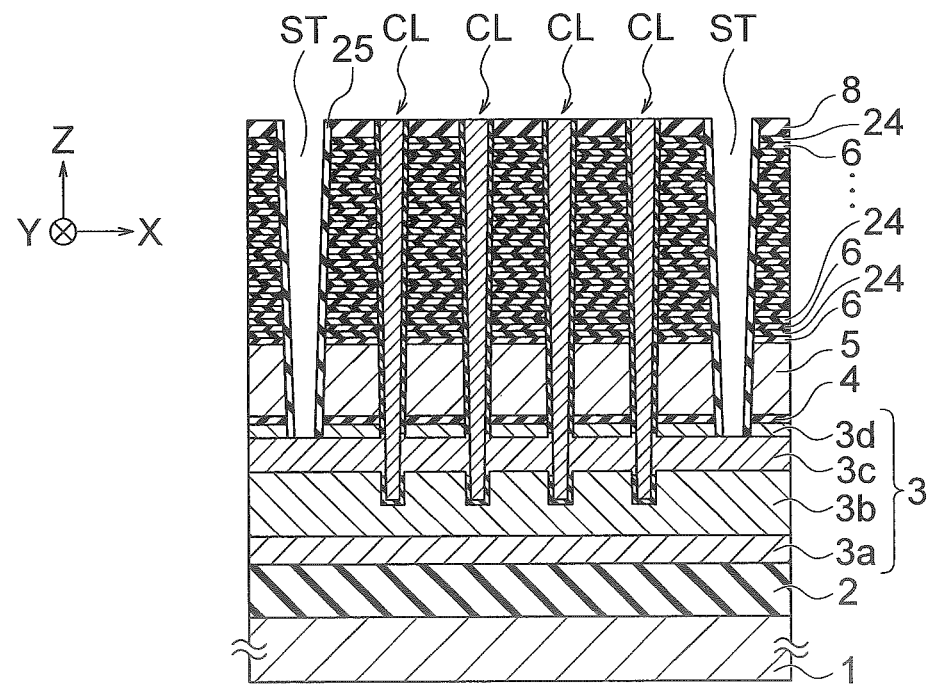

Next, the intermediate semiconductor layer 3c is formed in the hollow C1 by forming the intermediate semiconductor layer 3c on the surfaces of the upper semiconductor layer 3d, the lower semiconductor layer 3b, and the channel semiconductor layers 12, which are exposed in the hollow C1 (FIG. 8B). Consequently, the intermediate semiconductor layer 3c in contact with the upper semiconductor layer 3d, the lower semiconductor layer 3b, and the channel semiconductor layers 12 is formed between the upper semiconductor layer 3d and the lower semiconductor layer 3b. As above, the lower protecting film 21, the sacrificial layer 22, and the upper protecting film 23 are replaced by the intermediate semiconductor layer 3c (replacing step).

Figure 9A:
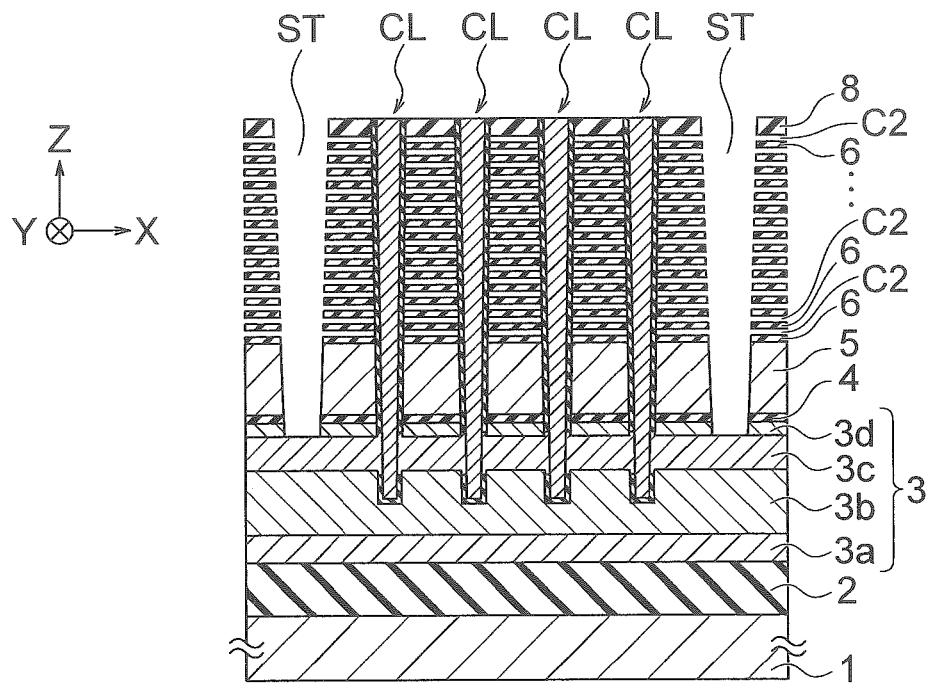
FIGS. 9A and 9B are sectional views showing steps in the method of manufacturing the semiconductor device of the first embodiment.

Next, the liner layers 25 in the slits ST and the sacrificial layers 24 between the insulating layers 6 are removed by wet etching or dry etching using the slits ST (FIG. 9A). Consequently, a plurality of hollows (air gaps) C2 are formed between these insulating layers 6.

Figure 9B:
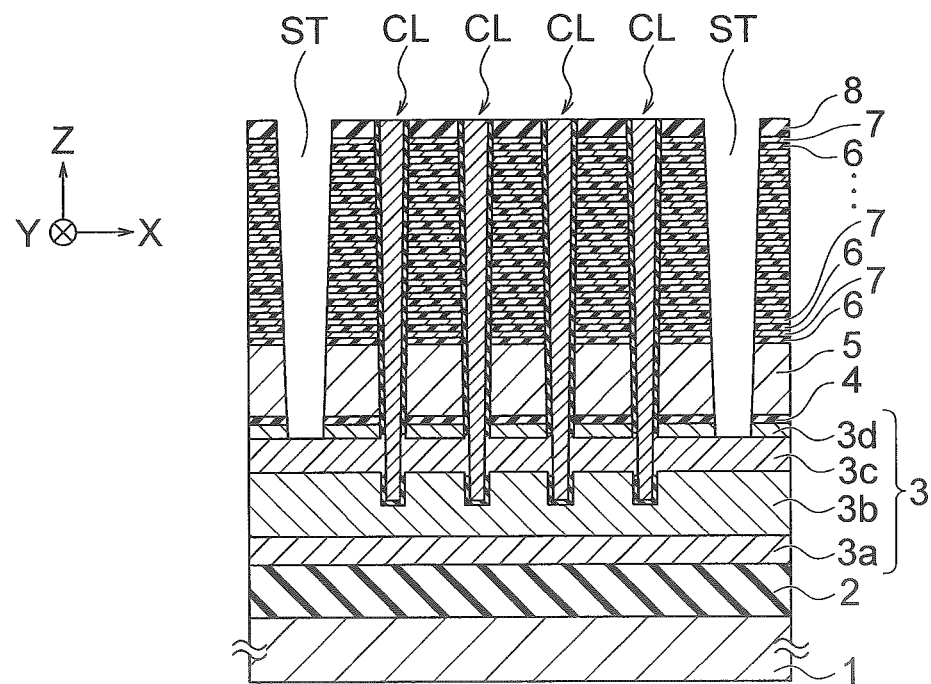

Next, the plurality of electrode layers 7 are formed in these hollows C2 by CVD (Chemical Vapor Deposition) (FIG. 9B). Consequently, the stacked film F alternately including the plurality of insulating layers 6 and the plurality of electrode layers 7 is formed between the gate layer 5 and the inter layer dielectric 8. As above, the sacrificial layers 24 are replaced by the electrode layers 7 (replacing step).

After that, the slit insulators 13 are formed in the slits ST. Furthermore, various plugs, interconnects, inter layer dielectrics and the like are formed on the substrate 1. As above, the semiconductor device shown in FIG. 1 is manufactured.

Figure 10:
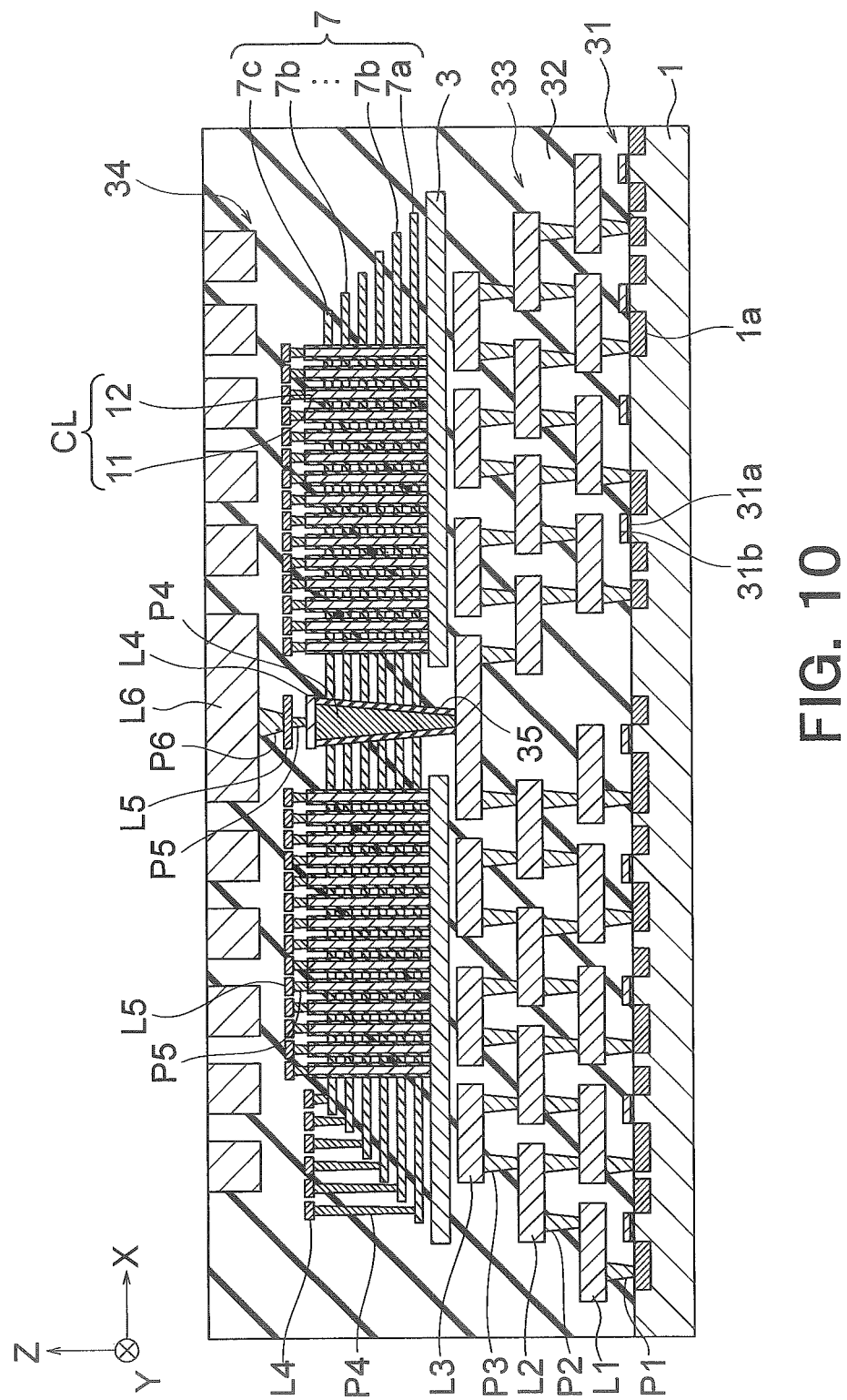
FIG. 10 is a sectional view showing the structure of the semiconductor device of the first embodiment.

FIG. 10 is a sectional view showing the structure of the semiconductor device of the first embodiment.

The semiconductor device of the present embodiment (FIG. 1) may have the structure shown in FIG. 10. The semiconductor device shown in FIG. 10 includes a plurality of transistors 31, an inter layer dielectric 32, a multilayer interconnect portion 33, a multilayer interconnect portion 34, and an insulator 35 in addition to the constituents shown in FIG. 1. Each of the transistors 31 includes a gate insulator 31a and a gate electrode 31b. The semiconductor device shown in FIG. 10 further includes a source-side selection line 7a, a plurality of word lines 7b, and a drain-side selection line 7c as the plurality of electrode layers 7.

The substrate 1 includes a plurality of diffusion layers 1a. These diffusion layers 1a are formed in the substrate 1 close to the surface of the substrate 1. For example, these diffusion layers 1a function as source regions and drain regions of the transistors 31.

Each of the transistors 31 includes the gate insulator 31a and the gate electrode 31b sequentially formed on the substrate 1. An example of the gate insulator 31a is a $SiO_2$ film. An example of the gate electrode 31b is a polysilicon layer. For example, the transistors 31 control operation of a memory cell array of the three-dimensional memory.

The inter layer dielectric 32 is formed on the substrate 1 and covers the transistors 31. An example of the inter layer dielectric 32 is a $SiO_2$ film. The source layer 3, the electrode layer 7, the multilayer interconnect portion 33, the multilayer interconnect portion 34, the insulator 35, and the columnar portions CL are formed in the inter layer dielectric 32.

The multilayer interconnect portion 33 includes a plurality of interconnect layers and a plurality of plugs electrically connected to these interconnect layers. The multilayer interconnect portion 33 of the present embodiment sequentially includes, above the substrate 1, an interconnect layer including a plurality of interconnects L1, an interconnect layer including a plurality of interconnects L2, and an interconnect layer including a plurality of interconnects L3. The multilayer interconnect portion 33 of the present embodiment further includes a plurality of plugs P1 each electrically connecting the substrate 1 or the transistor 31 to the interconnect L1, a plurality of plugs P2 electrically connecting the interconnects L1 and the interconnects L2 together, and a plurality of plugs P3 electrically connecting the interconnects L2 and the interconnects L3 together.

The source layer 3 is arranged above the multilayer interconnect portion 33. The plurality of electrode layers 7 include the source-side selection line 7a, the plurality of word lines 7b, and the drain-side selection line 7c sequentially arranged above the source layer 5. The columnar portions CL are arranged, on the source layer 3, in these electrode layers 7. The columnar portions CL include the memory insulators 11 and the channel semiconductor layers 12 sequentially provided in these electrode layers 7 as above.

The multilayer interconnect portion 34 includes a plurality of interconnect layers and a plurality of plugs electrically connected to these interconnect layers. The multilayer interconnect portion 34 of the present embodiment sequentially includes, above the electrode layers 7, an interconnect layer including a plurality of interconnects L4, an interconnect layer including a plurality of interconnects L5, and an interconnect layer including a plurality of interconnects L6. The multilayer interconnect portion 34 of the present embodiment further includes a plurality of plugs P4 each electrically connecting the electrode layer 7 or the interconnect L3 to the interconnect L4, a plurality of plugs P5 each electrically connecting the columnar portion CL or the interconnect L4 to the interconnect L5, and a plug P6 electrically connecting the interconnect L5 and the interconnect L6 together. For example, the interconnects L5 include bit lines electrically connected to the columnar portions CL.

The insulator 35 is formed on the lateral surface of the plug P4 that electrically connects the interconnect L3 of the multilayer interconnect portion 33 to the interconnect L4 of the multilayer interconnect portion 34. As shown in FIG. 10, this plug P4 is provided in the plurality of electrode layers 7 and penetrates these electrode layers 7. Moreover, the insulator 35 is provided between this plug P4 and the electrode layers 7 and electrically insulates this plug P4 from the electrode layers 7. An example of the insulator 35 is a $SiO_2$ film.

FIGS. 11A to 11D are sectional views showing the method of manufacturing the semiconductor device of the first embodiment. FIGS. 11A to 11D show details of the step shown in FIG. 4B, in other words, the step of forming the memory insulators 11 and the channel semiconductor layers 12 of the columnar portions CL in the memory holes MH.

Figure 11A:
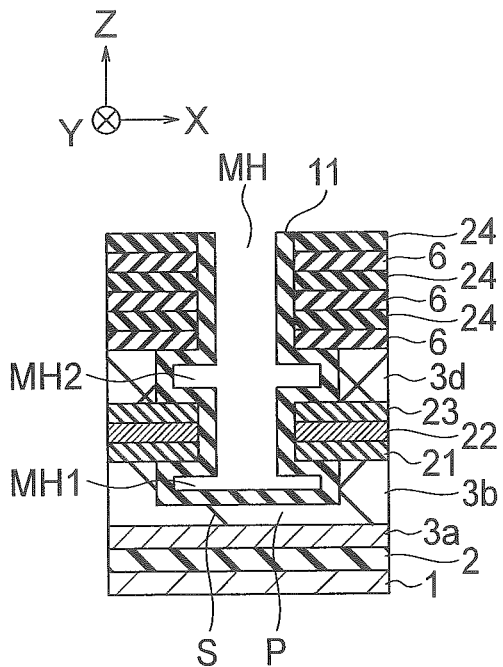
FIGS. 11A to 11D are sectional views showing the method of manufacturing the semiconductor device of the first embodiment.

First, the memory insulator 11 is formed on the surfaces of the sacrificial layers 24, the insulating layers 6, the upper semiconductor layer 3d, the upper protecting film 23, the sacrificial layer 22, the lower protecting film 21, and the lower semiconductor layer 3b in the memory hole MH (FIG. 11A). FIG. 11A has the inter layer dielectric 8, the gate layer 5, and the inter layer dielectric 4 omitted from the illustration.

The memory hole MH shown in FIG. 11A includes a portion MH1 formed in the lower semiconductor layer 3b, and a portion MH2 formed in the upper semiconductor layer 3d. Diameters of the portions MH1 and MH2 of the present embodiment are larger than diameters of other portions in the memory hole MH.

FIG. 11A further shows a plurality of crystal grains P included in the polycrystalline semiconductor layers, and grain boundaries S between the crystal grains P. In the present embodiment, the lower semiconductor layer 3b and the upper semiconductor layer 3d are polycrystalline semiconductor layers such as polysilicon layers, and FIG. 11A shows the crystal grains P and the grain boundaries S in the lower semiconductor layer 3b and the upper semiconductor layer 3d.

Figure 11B:
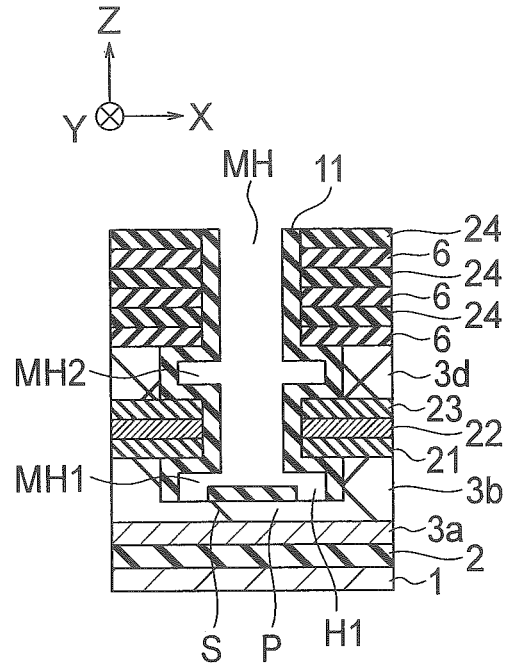

Next, a portion of the memory insulator 11 in the memory hole MH is removed (FIG. 11B). Openings H1 are formed in the memory insulator 11. FIG. 11B shows two openings H1 formed in the memory insulator 11. Since the openings H1 of the present embodiment are formed in the memory insulator 11 at the bottom portion of the memory hole MH, the upper surface of the lower semiconductor layer 3b is exposed in the openings H1. The shape of each of the openings H1 in plan view is a circle, an ellipse, a square or a rectangle, for example.

An example of etching performed in FIG. 11B is dry etching such as RIE or CDE. Since corner portions of the memory insulator 11 are often weak against etching, the openings H1 shown in FIG. 11B are formed at corner portions of the memory insulator 11 in the bottom portion of the memory hole MH. The openings H1 may be formed at other portions in the memory insulator 11 and, for example, may be formed at a center portion of the memory insulator 11 in the bottom portion of the memory hole MH.

Figure 11C:
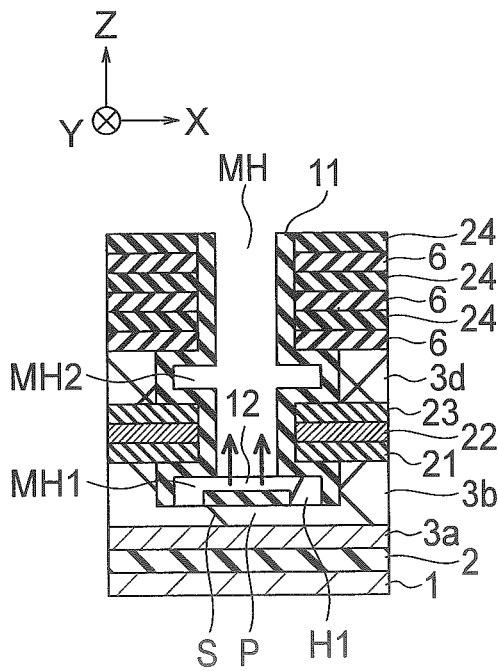
Figure 11D:
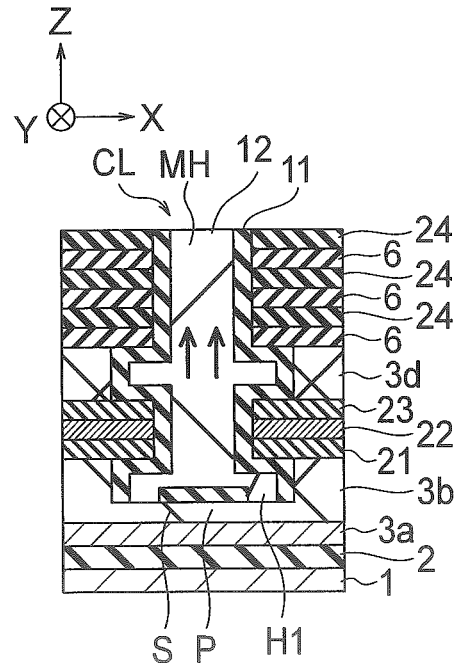

Next, the channel semiconductor layer 12 is formed in the memory hole MH via the memory insulator 11 (FIGS. 11C and 11D). The channel semiconductor layer 12 of the present embodiment is formed by epitaxial growth from the lower semiconductor layer 3b that is exposed in the openings H1. Consequently, the channel semiconductor layer 12 is formed on the surface of the memory insulator 11 and on the surface of the lower semiconductor layer 3b. FIGS. 11C and 11D show a situation of advancing epitaxial growth of the channel semiconductor layer 12. The channel semiconductor layer 12 of the present embodiment is a polycrystalline semiconductor layer such as a polysilicon layer and is oriented to a [001] direction relative to the interface between the channel semiconductor layer 12 and the lower semiconductor layer 3b. The interface between the channel semiconductor layer 12 and the lower semiconductor layer 3b of the present embodiment is parallel to the XY-plane.

FIG. 11D shows the crystal grains P and the grain boundaries S in the lower semiconductor layer 3b, the upper semiconductor layer 3d, and the channel semiconductor layer 12. When the channel semiconductor layer 12 is formed by epitaxial growth from the lower semiconductor layer 3b that is exposed in the openings H1, the grain sizes of the crystal grains P in the channel semiconductor layer 12 are affected by the shapes of the openings H1. The present embodiment makes it possible to make the grain sizes of the crystal grains P in the channel semiconductor layer 12 large by setting the sizes of the openings H1 to be small. For example, this makes it possible to make the grain sizes of the crystal grains P in the channel semiconductor layer 12 larger than the grain sizes of the crystal grains P in the lower semiconductor layer 3b. The crystal grains P in the lower semiconductor layer 3b are an example of the first crystal grain, and the crystal grains P in the channel semiconductor layer 12 are an example of the second crystal grain.

The channel semiconductor layer 12 of the present embodiment is a polycrystalline semiconductor layer as with the lower semiconductor layer 3b. Nevertheless, the channel semiconductor layer 12 is a polycrystalline semiconductor layer close to a monocrystalline semiconductor layer (which is a monosilicon layer, for example) since the grain sizes of the crystal grains P in the channel semiconductor layer 12 are large. FIG. 11D shows the lower semiconductor layer 3b including the crystal grains P with small grain sizes, and the channel semiconductor layer 12 including the crystal grains P with large grain sizes. In the present embodiment, an average grain size of all the crystal grains P in the channel semiconductor layer 12 is larger than an average grain size of all the crystal grains P in the lower semiconductor layer 3b.

Figure 12:
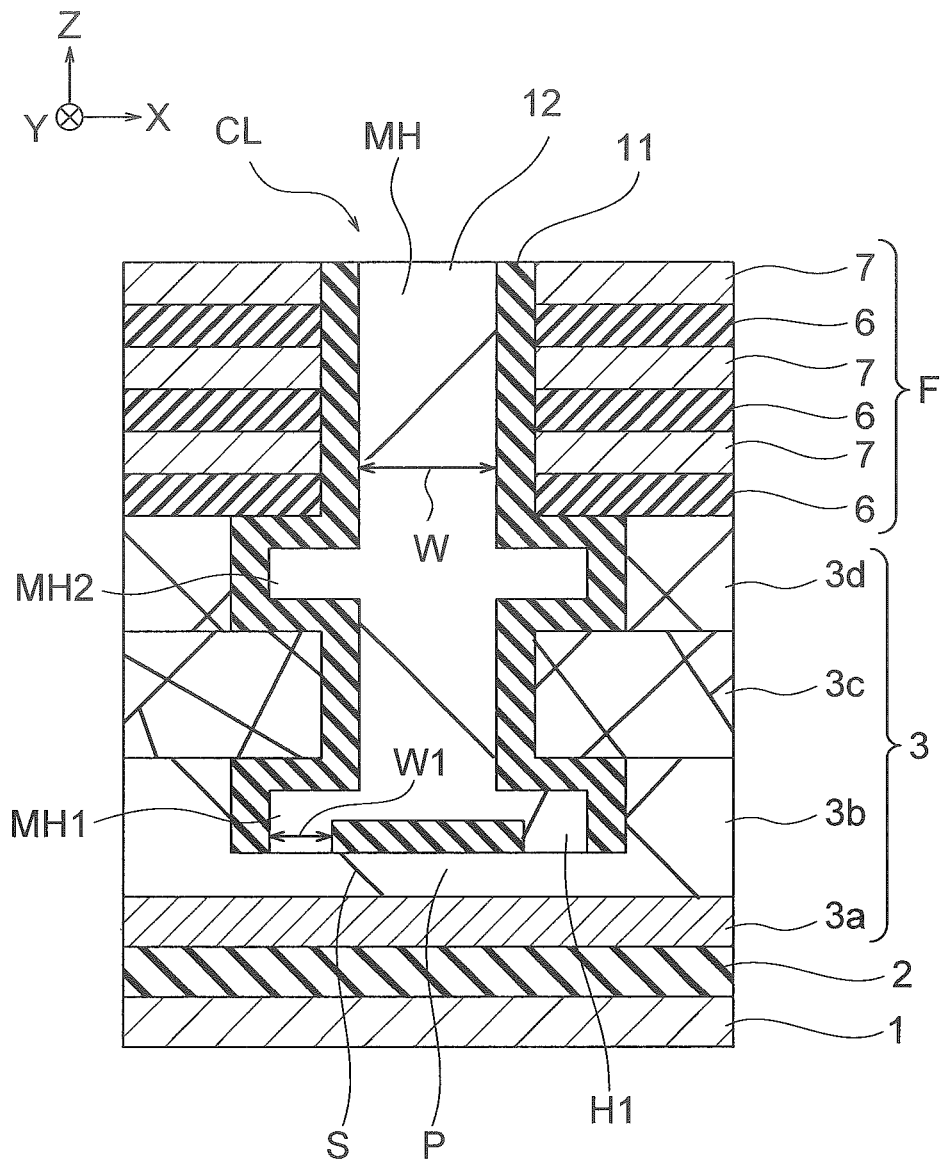
FIG. 12 is a sectional view showing the structure of the semiconductor device of the first embodiment.
Figure 13A:
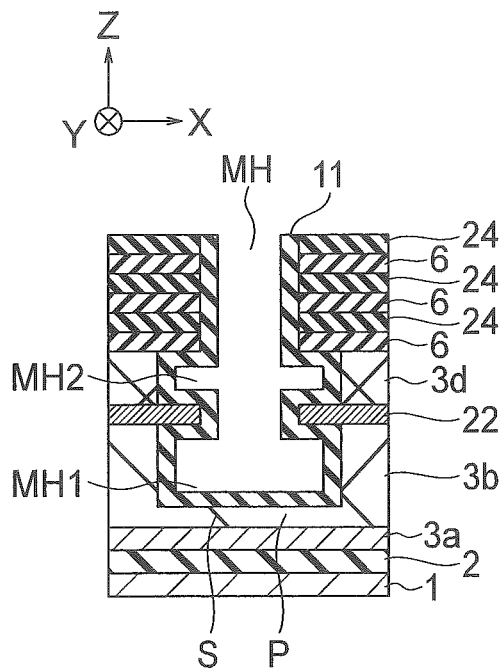
FIGS. 13A to 13D are sectional views showing a method of manufacturing a semiconductor device according to a modification of the first embodiment.
Figure 13B:
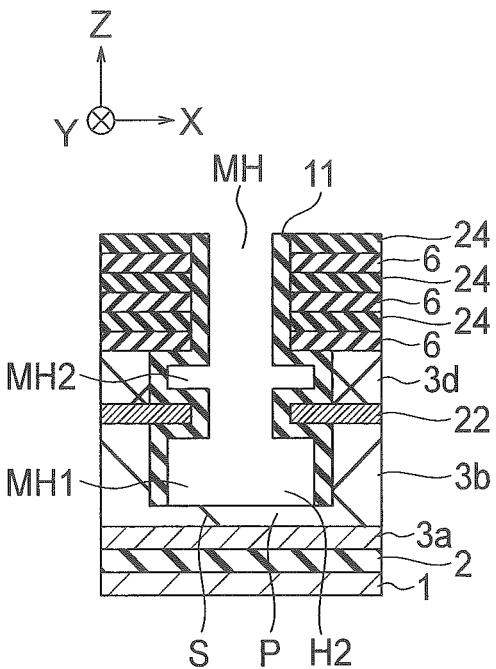
Figure 13C:
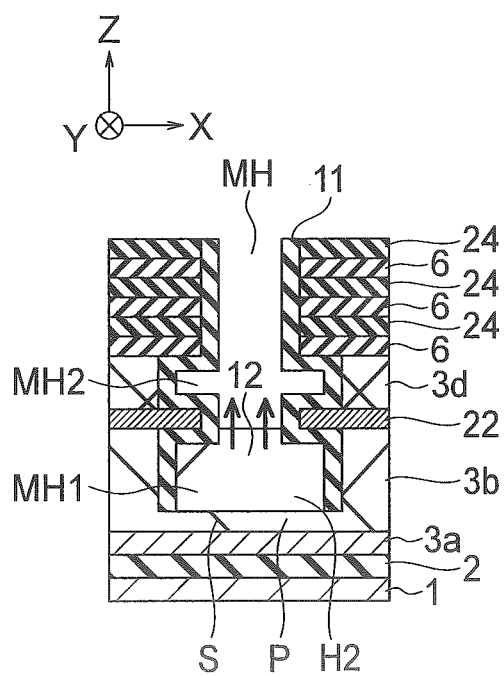
Figure 13D:
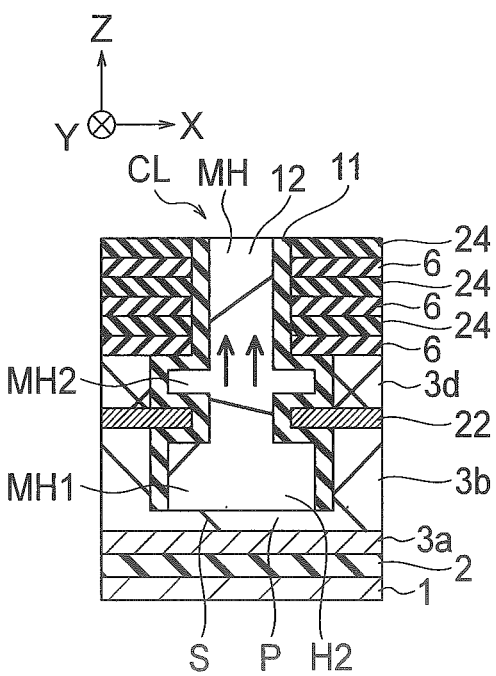

FIG. 12 is a sectional view showing the structure of the semiconductor device of the first embodiment.

FIG. 12 shows a structure of the semiconductor device of the present embodiment as with FIG. 1, and shows the same region as the region shown in FIGS. 11A to 11D. FIG. 12 shows the width "W1" of the channel semiconductor layer 12 in each of the openings H1 and the width "W" of the channel semiconductor layer 12 in the stacked film F.

The width "W1" of the channel semiconductor layer 12 in the opening H1 is, in other words, the width of the opening H1. As mentioned above, the grain sizes of the crystal grains P in the channel semiconductor layer 12 can be made large by setting the sizes of the openings H1 to be small. Specifically, the grain sizes of the crystal grains P in the channel semiconductor layer 12 can be made large by setting the maximum value of the width of the opening H1, that is, the maximum value of the width "W1" to be small.

The maximum value of the width of the opening H1 is given as the maximum dimension of the shape of the opening H1 in plan view, that is, the planar shape of the opening H1. For example, when the planar shape of the opening H1 is a circle, the maximum value of the width of the opening H1 is the diameter of the circle. Moreover, when the planar shape of the opening H1 is an ellipse, the maximum value of the width of the opening H1 is its diameter in the major axis. Otherwise, when the planar shape of the opening H1 is a square or a rectangle, the maximum value of the width of the opening H1 is the length of a diagonal line of the square or the rectangle.

In the present embodiment, it is desirable to set the maximum value of the width "W1", that is, the maximum value of the width of each of the openings H1 to be smaller than the average grain size of the crystal grains P in the lower semiconductor layer 3b. For example, when the average grain size of the crystal grains P in the lower semiconductor layer 3b is 10 nm, the maximum value of the width "H1" is desirably set to be smaller than 10 nm. The present embodiment makes it possible to make the grain sizes of the crystal grains P in the channel semiconductor layer 12 larger than the maximum value of the width "W1" by epitaxial growth of the channel semiconductor layer 12 from the openings H1. This makes it possible to form the channel semiconductor layer 12 including the crystal grains P with large grain sizes.

The width "W" of the channel semiconductor layer 12 in the stacked film F takes a value obtained by subtracting twice the film thickness of the memory insulator 11 from the width of the memory hole MH. An example of the planar shape of the channel semiconductor layer 12 of the present embodiment is a circle. In this case, the width "W" of the channel semiconductor layer 12 is the diameter of the channel semiconductor layer 12.

In general, the diameter of the memory hole MH is often not constant due to various causes while it is desirably constant from the upper end to the lower end of the memory hole MH. Examples of such causes include tapering of the lateral surface of the memory hole MH, and bowing thereof. Such phenomena tend to arise when the aspect ratio of the memory hole MH is high. As the diameter of the memory hole MH varies, the width of "W" of the channel semiconductor layer 12 also varies. Therefore, the width "W" of the channel semiconductor layer 12 generally takes the maximum value at a certain height between the upper end and the lower end of the memory hole MH and takes the minimum value at another height between the upper end and the lower end of the memory hole MH.

In the present embodiment, the channel semiconductor layer 12 grows in the +Z-direction in the stacked film F through epitaxial growth (see FIGS. 11C and 11D). Therefore, each of the crystal grains P in the channel semiconductor layer 12 takes a shape long in the Z-direction, and the grain sizes of the crystal grains P in the channel semiconductor layer 12 are often defined by the dimensions of the crystal grains P in the Z-direction. Consequently, the grain sizes of the crystal grains P in the channel semiconductor layer 12 are longer than the width "W" of the channel semiconductor layer 12 in the stacked film F, and is often longer than the maximum value of the width "W". As above, the present embodiment makes it possible to make the grain sizes of the crystal grains P in the channel semiconductor layer 12 larger than the maximum value of the width "W". This makes it possible to form the channel semiconductor layer 12 including the crystal grains P with large grain sizes.

FIGS. 13A to 13D are sectional views showing a method of manufacturing a semiconductor device according to a modification of the first embodiment.

The steps shown in FIGS. 13A to 13D are performed similarly to the steps shown in FIGS. 11A to 11D, respectively. While the memory insulator 11 shown in FIG. 11B has the two small openings H1 at the bottom portion of the memory hole MH, the memory insulator 11 shown in FIG. 13B has one large opening H2 at the bottom portion of the memory hole MH. As above, the size and the number of opening(s) provided in the memory insulator 11 can be set to various sizes and numbers.

Figure 14:
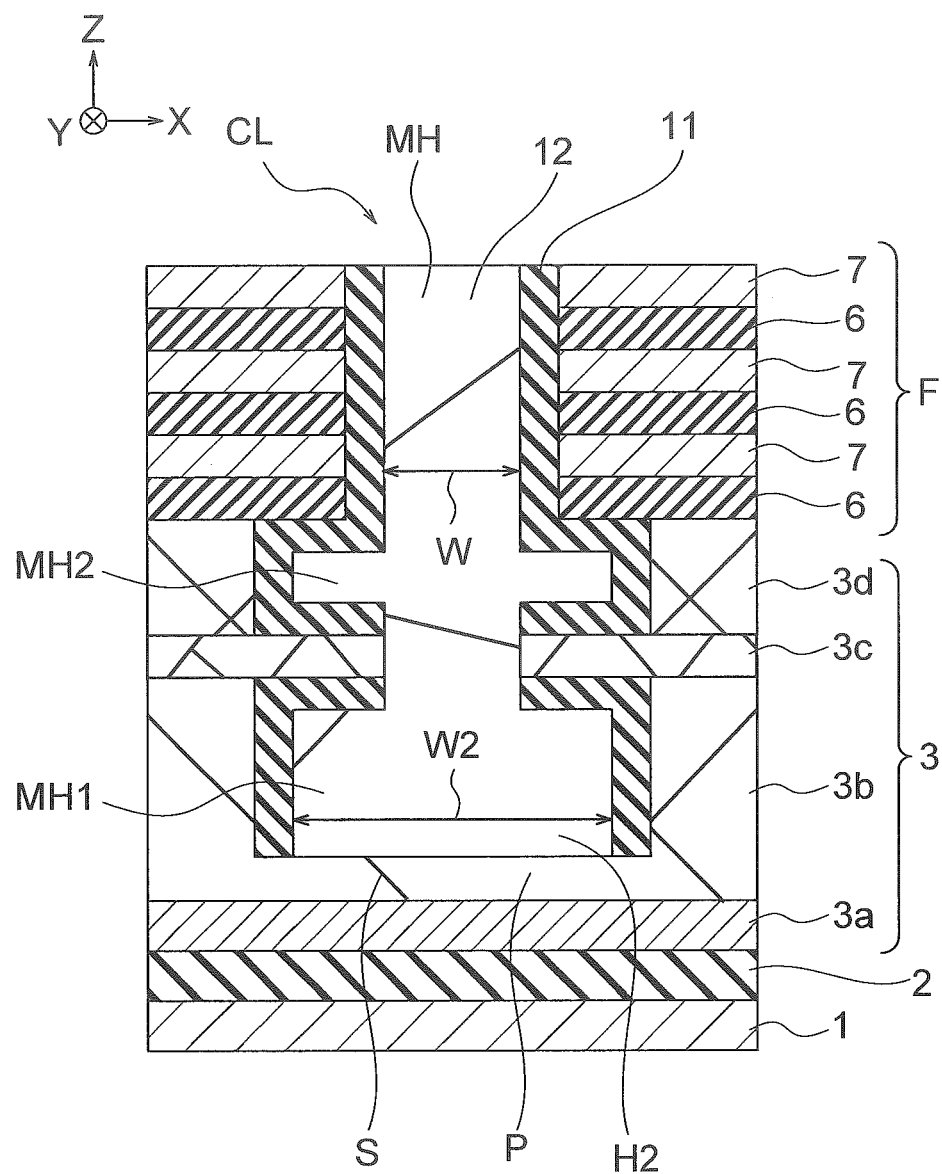
FIG. 14 is a sectional view showing a structure of the semiconductor device according to the modification of the first embodiment.

FIG. 14 is a sectional view showing a structure of the semiconductor device according to the modification of the first embodiment.

FIG. 14 shows the structure of the semiconductor device manufactured through the steps shown in FIGS. 11A to 11D. FIG. 14 shows the width "W2" of the channel semiconductor layer 12 in the opening H2, and the width "W" of the channel semiconductor layer 12 in the stacked film F. The matters of description of the widths "W1" and "W" with reference to FIG. 12 can also be applied to the widths "W2" and "W" shown in FIG. 14.

Figure 15A:
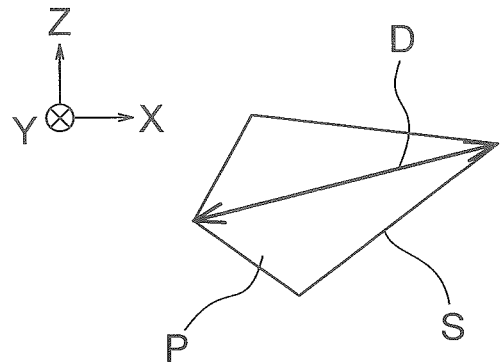
FIGS. 15A to 15C are sectional views for explaining the grain sizes D of crystal grains P of the first embodiment.
Figure 15B:
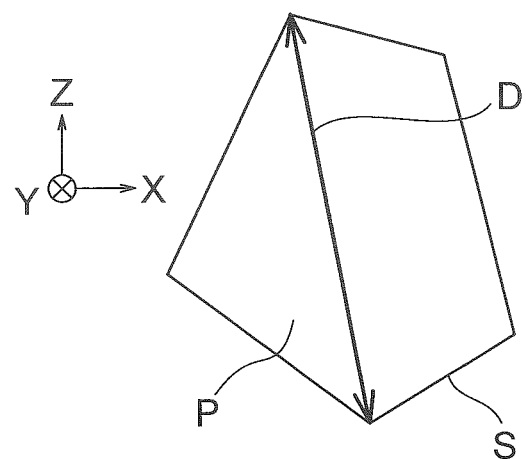
Figure 15C:
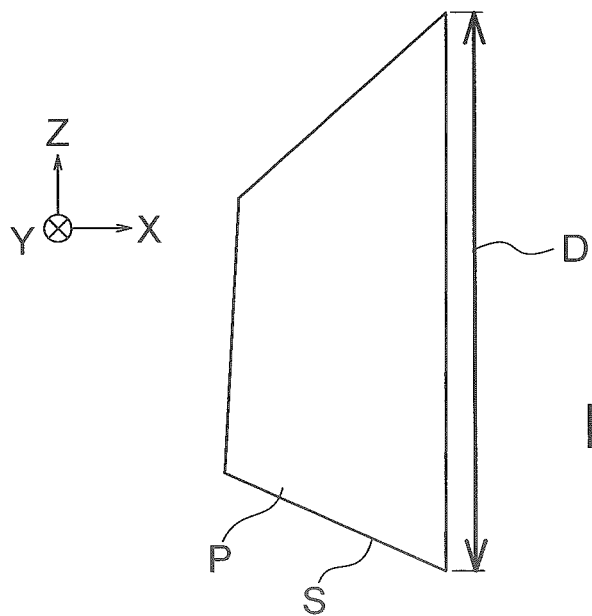

FIGS. 15A to 15C are sectional views for explaining the grain sizes "D" of the crystal grains P in the first embodiment.

FIGS. 15A, 15B and 15C show three examples of the crystal grain P in the lower semiconductor layer 3b, the upper semiconductor layer 3d, or the channel semiconductor layer 12. FIGS. 15A, 15B and 15C show the grain boundaries S and the grain sizes "D" of the crystal grains P.

The grain size "D" of each of the crystal grains P in the present embodiment is given as the maximum dimension of the crystal grain P, for example. Since the maximum dimension of the crystal grain P shown in FIG. 15A is given with a diagonal line between corner portions of the crystal grain P, the grain size "D" of this crystal grain P is the length of this diagonal line. Since the maximum dimension of the crystal grain P shown in FIG. 15B is also given with a diagonal line between corner portions of the crystal grain P, the grain size "D" of this crystal grain P is the length of this diagonal line. On the other hand, since the maximum dimension of the crystal grain P shown in FIG. 15C is given with a side of the crystal grain P, the grain size "D" of this crystal grain P is the length of this side.

Since in the present embodiment, the memory holes MH extend in the Z-direction, the shapes of the crystal grains P in the channel semiconductor layers 12 often resemble the shape shown in FIG. 15C. Therefore, the grain sizes "D" of the crystal grains P in the channel semiconductor layers 12 are often given as with the grain size "D" of the crystal grain P shown in FIG. 15C.

As above, the channel semiconductor layers 12 of the present embodiment are formed by epitaxial growth from the lower semiconductor layer 3b that is exposed in the openings H1. The present embodiment therefore makes it possible to make the grain sizes "D" of the crystal grains P in the channel semiconductor layer 12 large. This makes it possible to achieve improvement of performance of the channel semiconductor layers 12, such as increase of cell current.

Epitaxial growth of the channel semiconductor layers 12 from the substrate 1 can also be considered when the channel semiconductor layers 12 are formed by epitaxial growth. However, in this case, the channel semiconductor layers 12 need to be arranged near the substrate 1. The present embodiment makes it possible to form the channel semiconductor layers 12 even when the channel semiconductor layers 12 are not arranged near the substrate 1, by epitaxial growth of the channel semiconductor layers 12 from the lower semiconductor layer 3b.

Second Embodiment

Figure 16:
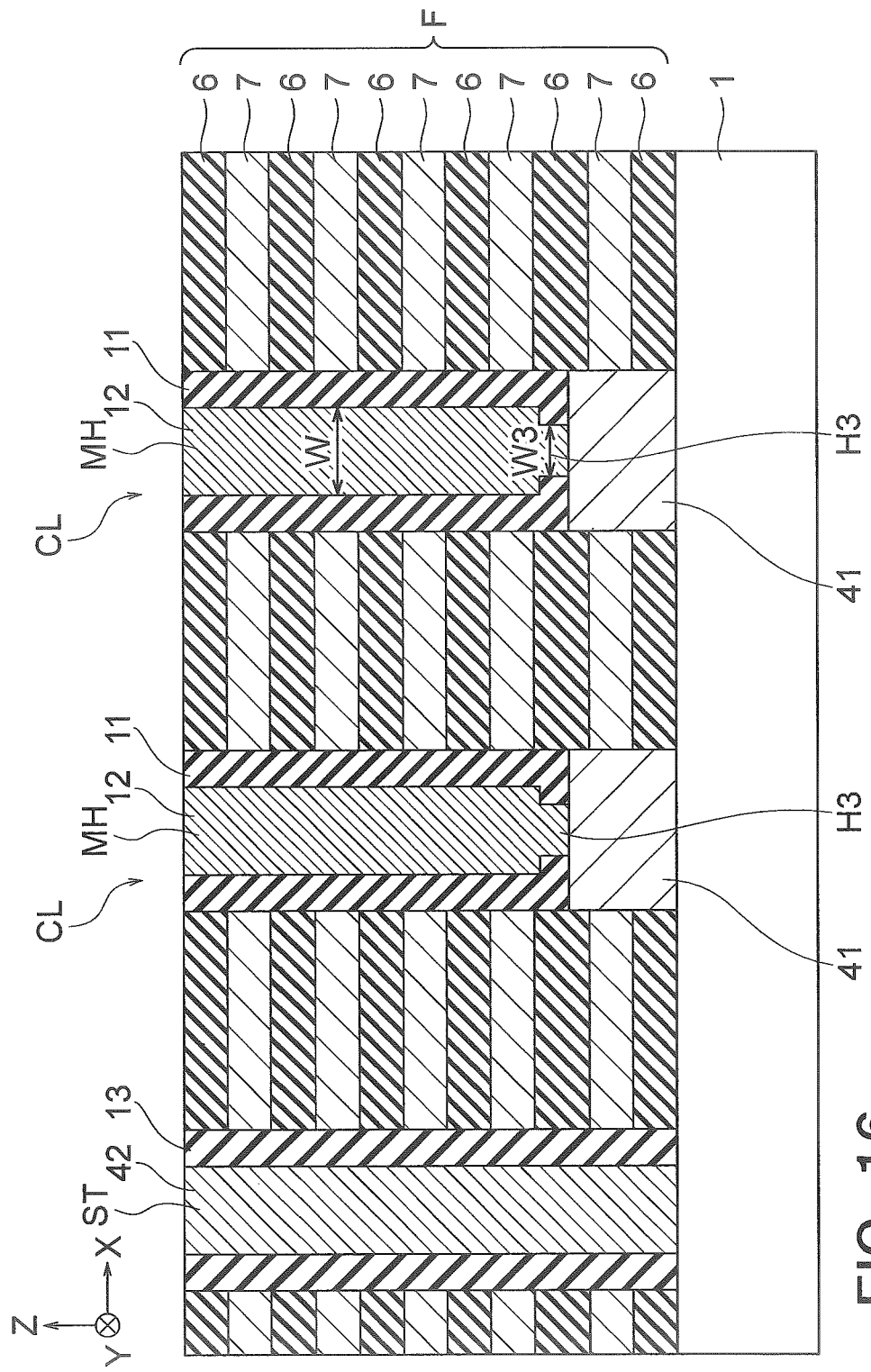
FIG. 16 is a sectional view showing a structure of a semiconductor device of a second embodiment.

FIG. 16 is a sectional view showing a structure of a semiconductor device of a second embodiment.

As with the semiconductor device of the first embodiment (FIG. 1), the semiconductor device of the present embodiment (FIG. 16) includes the substrate 1, the plurality of insulating layers 6, the plurality of electrode layers 7, the plurality of memory insulators 11, the plurality of channel semiconductor layers 12, and the slit insulator 13. The semiconductor device of the present embodiment further includes semiconductor layers 41 and a semiconductor layer 42. Each of the semiconductor layers 41 is an example of the first semiconductor layer.

Hereafter, details of the semiconductor device of the present embodiment are described. For the present embodiment, its differences from the first embodiment are mainly described and the matters common to it and the first embodiment are properly omitted from the description.

The stacked film F of the present embodiment includes the plurality of insulating layers 6 and the plurality of electrode layers 7 alternately stacked on the substrate 1. FIG. 16 shows two memory holes MH and one slit ST which are formed in the stacked film F. These memory holes MH and slit ST penetrate the stacked film F.

Each of the memory holes MH includes the memory insulator 11, the channel semiconductor layer 12, and the semiconductor layer 41. The semiconductor layers 41 are formed, on the substrate 1, in the stacked film F. The memory insulators 11 are formed on upper surfaces of the semiconductor layers 41 and on lateral surfaces of the stacked film F and have openings H3 on the semiconductor layers 41. The channel semiconductor layers 12 are formed on surfaces of the memory insulators 11 and formed on upper surfaces, of the semiconductor layers 41, that are exposed in the openings H3. Consequently, the channel semiconductor layers 12 are in contact with the semiconductor layers 41 and are electrically connected to the semiconductor layers 41. Each of the columnar portions CL includes the memory insulator 11 and the channel semiconductor layer 12 and has a solid columnar shape extending in the Z-direction. An example of the XY-sectional shape of each columnar portion CL is a circle or a figure close to a circle.

An example of the substrate 1 is a semiconductor substrate such as a Si substrate. An example of each of the semiconductor layers 41 is a monocrystalline semiconductor layer (for example, a monosilicon layer) formed by epitaxial growth from the substrate 1 or a polycrystalline semiconductor layer (for example, a polysilicon layer). An example of each of the memory insulators 11 is similar to the example described for the first embodiment. An example of each of the channel semiconductor layers 12 is a polycrystalline semiconductor layer (for example, a polysilicon layer) formed by epitaxial growth from the semiconductor layer 41 that is exposed in the opening H3.

FIG. 16 shows the width "WY" of each of the channel semiconductor layers 12 in the openings H3, and "W" of each of the channel semiconductor layers 12 in the stacked film F. The matters of description of the widths "W1" and "W" with reference to FIG. 12 can also be applied to the widths "W3" and "W" shown in FIG. 16. As with the first embodiment, the present embodiment makes it possible to make the grain sizes of the crystal grains in the channel semiconductor layers 12 larger than the grain sizes of the crystal grains in the semiconductor layers 41.

The slit ST includes the slit insulator 13 and the semiconductor layer 42. The slit insulator 13 is formed on a lateral surface of the stacked film F. The semiconductor layer 42 is formed on an upper surface of the substrate 1 and a lateral surface of the slit insulator 13 and is used as an interconnect. The semiconductor layer 42 may be formed in any of the slits ST of the first embodiment.

The stacked film F includes the plurality of electrode layers 7 that are positioned laterally from the channel semiconductor layers 12, and the electrode layer 7 that is positioned laterally from the semiconductor layers 41. The electrode layers 7 first mentioned are provided on lateral surfaces of the channel semiconductor layers 12 via the memory insulators 11 and function, for example, as word lines. The electrode layer 7 second mentioned is provided on lateral surfaces of the semiconductor layers 41 via not-shown insulators and functions, for example, as a selection line. Meanwhile, the substrate 1 of the present embodiment functions as a source line. The substrate 1 of the present embodiment may be a multilayer substrate including a semiconductor substrate such as a Si substrate and a semiconductor layer provided on the semiconductor substrate via an insulator.

As above, the channel semiconductor layers 12 of the present embodiment are formed by epitaxial growth from the semiconductor layers 41 that are exposed in the openings H3. The present embodiment therefore makes it possible to make the grain sizes of the crystal grains in the channel semiconductor layers 12 large. This makes it possible to achieve improvement of performance of the channel semiconductor layers 12, such as increase of cell current.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a substrate;
   a first semiconductor layer provided on the substrate and including a first crystal grain;
   a first film provided on a surface of the first semiconductor layer; and
   a second semiconductor layer provided on a surface of the first film, and provided on the surface of the first semiconductor layer via an opening in the first film, the second semiconductor layer including a second crystal grain and being included in a memory cell,
   wherein a grain size of the second crystal grain is larger than a maximum value of a width of the second semiconductor layer in the opening in a direction parallel to a surface of the substrate.

2. The device of claim 1, wherein the grain size of the second crystal grain is larger than a grain size of the first crystal grain.

3. The device of claim 1, further comprising a stacked film provided on the substrate and alternately including a plurality of insulating layers and a plurality of electrode layers, wherein
   the first film and the second semiconductor layer are provided in the stacked film, and
   the grain size of the second crystal grain is larger than a maximum value of a width of the second semiconductor layer in the stacked film in a direction parallel to a surface of the substrate.

4. The device of claim 3, wherein the first semiconductor layer is provided between the substrate and the stacked film.

5. The device of claim 4, wherein the first semiconductor layer is included in a source line, and the plurality of electrode layers include word lines.

6. The device of claim 3, wherein the first semiconductor layer is provided in the stacked film.

7. The device of claim 6, wherein the substrate functions as a source line, and the plurality of electrode layers include word lines.

8. The device of claim 1, wherein the first semiconductor layer is a polycrystalline semiconductor layer.

9. The device of claim 1, wherein the first semiconductor layer includes Si (silicon), and includes P (phosphorus) or As (arsenic).

10. The device of claim 1, wherein the second semiconductor layer is a polycrystalline semiconductor layer.

11. The device of claim 1, wherein the second semiconductor layer includes Si (silicon), and includes B (boron) or Ge (germanium).

12. The device of claim 1, wherein the second semiconductor layer is oriented to a [001] direction relative to an interface between the first semiconductor layer and the second semiconductor layer.

13. The device of claim 1, wherein
the second semiconductor layer has a solid columnar shape extending in a predetermined direction, and
the first film has a hollow columnar shape extending in the predetermined direction around the second semiconductor layer.

14. The device of claim 1, wherein the first film includes an insulator.

15. The device of claim 1, wherein the first film includes a charge storage layer included in the memory cell.

16. A method of manufacturing a semiconductor device, comprising:
forming a first semiconductor layer on a substrate;
forming a first film on a surface of the first semiconductor layer; and
forming a second semiconductor layer on a surface of the first film, and on the surface of the first semiconductor layer via an opening in the first film,
wherein
the first semiconductor layer is formed to include a first crystal grain,
the second semiconductor layer is formed in a memory cell to include a second crystal grain, and
the second semiconductor layer is formed such that a grain size of the second crystal grain is larger than a maximum value of a width of the second semiconductor layer in the opening in a direction parallel to a surface of the substrate.

17. The method of claim 16, wherein the second semiconductor layer is formed such that the grain size of the second crystal grain is larger than a grain size of the first crystal grain.

18. The method of claim 16, further comprising forming, on the substrate, a stacked film alternately including a plurality of insulating layers and a plurality of electrode layers,
wherein
the first film and the second semiconductor layer are formed in the stacked film, and
the second semiconductor layer is formed such that the grain size of the second crystal grain is larger than a maximum value of a width of the second semiconductor layer in the stacked film in a direction parallel to a surface of the substrate.

19. The method of claim 16, wherein the second semiconductor layer is formed by epitaxial growth from the first semiconductor layer.

20. The method of claim 16, wherein the first semiconductor layer includes a first layer formed before the first film is formed, and a second layer formed after the first film is formed.

* * * * *